United States Patent
Lehtola

(10) Patent No.: US 10,218,321 B2
(45) Date of Patent: *Feb. 26, 2019

(54) THERMALLY RUGGED POWER AMPLIFIERS AND RELATED METHODS

(71) Applicant: SKYWORKS SOLUTIONS, INC., Woburn, MA (US)

(72) Inventor: Philip John Lehtola, Cedar Rapids, IA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/729,617

(22) Filed: Oct. 10, 2017

(65) Prior Publication Data

US 2018/0097483 A1    Apr. 5, 2018

Related U.S. Application Data

(63) Continuation of application No. 15/043,556, filed on Feb. 13, 2016, now Pat. No. 9,787,260.

(Continued)

(51) Int. Cl.
*H03F 3/21* (2006.01)
*H03F 3/24* (2006.01)
(Continued)

(52) U.S. Cl.
CPC .......... *H03F 3/211* (2013.01); *H03F 1/0261* (2013.01); *H03F 1/0288* (2013.01); *H03F 1/22* (2013.01);
(Continued)

(58) Field of Classification Search
USPC .............................. 330/307, 311, 295, 124 R
See application file for complete search history.

(56) References Cited

U.S. PATENT DOCUMENTS 5,066,926 A   11/1991   Ramachandran et al.
7,429,894 B2   9/2008   Chang et al.
(Continued)

FOREIGN PATENT DOCUMENTS

CN   201680021110.3   10/2017
JP   2014222836 A   11/2014
(Continued)

OTHER PUBLICATIONS

International Search Report and Written Opinion for PCT/US2016/017917 dated Jun. 17, 2016.

*Primary Examiner* — Hieu Nguyen
(74) *Attorney, Agent, or Firm* — Chang & Hale LLP

(57) ABSTRACT

Thermally rugged power amplifiers and related methods. In some embodiments, a method for manufacturing a radio-frequency amplifier can include providing or forming a semiconductor substrate, and forming an array of cascoded devices on the semiconductor substrate to be capable of amplifying a signal, such that the array of cascoded devices includes a plurality of cascoded devices arranged in a first row and a plurality of cascoded devices arranged in a second row. Each cascoded device can include an input stage and an output stage arranged in a cascode configuration, and each of the first and second rows can be configured such that the output stages are positioned in a staggered orientation. The staggered arrangement of the cascoded devices in the first row can be offset relative to the staggered arrangement of the cascoded devices in the second row to avoid a direct row-to-row adjacent pair of output stages.

20 Claims, 14 Drawing Sheets

Related U.S. Application Data

(60) Provisional application No. 62/116,509, filed on Feb. 15, 2015, provisional application No. 62/116,508, filed on Feb. 15, 2015.

(51) Int. Cl.
- *H03F 1/56* (2006.01)
- *H03F 1/22* (2006.01)
- *H03F 1/02* (2006.01)
- *H03F 3/195* (2006.01)
- *H04B 1/04* (2006.01)

(52) U.S. Cl.
CPC ............ *H03F 1/565* (2013.01); *H03F 3/195* (2013.01); *H03F 3/24* (2013.01); *H03F 3/245* (2013.01); *H03F 2200/451* (2013.01); *H04B 2001/0408* (2013.01)

(56) References Cited

U.S. PATENT DOCUMENTS

| | | |
|---|---|---|
| 7,961,052 B2 | 6/2011 | Bacon et al. |
| 9,787,260 B2 | 10/2017 | Lehtola |
| 2003/0164738 A1 | 9/2003 | Wu et al. |
| 2013/0130630 A1 | 5/2013 | Crandall |

FOREIGN PATENT DOCUMENTS

| | | |
|---|---|---|
| KR | 10-2017-7025633 | 9/2017 |
| WO | PCT/US2016/017917 | 2/2016 |

3V COMMON EMITTER
0.13mm²

PARALLEL CASCODE
0.1745mm²

STAGGERED CASCODE
0.1743mm²

THERMALLY RUGGED POWER AMPLIFIERS AND RELATED METHODS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application is a continuation of U.S. application Ser. No. 15/043,556 filed Feb. 13, 2016, entitled POWER AMPLIFIER HAVING STAGGERED CASCODE LAYOUT FOR ENHANCED THERMAL RUGGEDNESS, which claims priority to U.S. Provisional Application No. 62/116,509 filed Feb. 15, 2015, entitled POWER AMPLIFIER HAVING STAGGERED CASCODE LAYOUT FOR ENHANCED THERMAL RUGGEDNESS, and U.S. Provisional Application No. 62/116,508 filed Feb. 15, 2015, entitled CASCODE AMPLIFIER SEGMENTATION FOR ENHANCED THERMAL RUGGEDNESS, the benefits of the filing dates of which are hereby claimed and the disclosures of which are hereby expressly incorporated by reference herein in their entirety.

BACKGROUND

Field

The present disclosure relates to power amplifiers for radio-frequency (RF) applications.

Description of the Related Art

In many radio-frequency (RF) applications, an RF signal to be transmitted is typically amplified by a power amplifier. Such a power amplifier can generate heat and/or be affected by heat.

SUMMARY

According to a number of implementations, the present disclosure relates to a radio-frequency (RF) amplifier that includes an input node and an output node configured to receive an RF signal and provide an amplified RF signal, respectively. The RF amplifier further includes an array of cascoded devices implemented between the input node and the output node to generate the amplified RF signal. Each cascoded device includes a common emitter transistor and a common base transistor arranged in a cascode configuration. The array is configured such that the common base transistors are positioned in a staggered orientation relative to each other.

In some embodiments, the staggered orientation of the common base transistors can provide an increase in a nearest pair spacing, when compared to a non-staggered orientation. The common base transistor can be configured to handle more power than the common emitter transistor. The increased spacing can result in a smaller rise in temperature due to the operation of the RF amplifier, when compared to the non-staggered orientation. The rise in temperature resulting from the staggered orientation can be less than half of the rise in temperature resulting from the non-staggered orientation.

In some embodiments, the cascoded devices can be electrically connected in parallel such that each of the input node and the output node is a respective common node for the cascoded devices.

In some embodiments, the array of cascoded devices can include a plurality of cascoded devices arranged in the staggered orientation in a first row. The plurality of cascoded devices in the first row can be electrically connected in parallel. The plurality of cascoded devices in the first row can be coupled to a common input and a common output.

In some embodiments, the array of cascoded devices can further include a plurality of cascoded devices arranged in the staggered orientation in a second row. The staggered arrangement of cascoded devices in the first row and the staggered arrangement of cascoded devices in the second row can be offset to avoid direct row-to-row adjacent pair of common base transistors. The plurality of cascoded devices in each row can be coupled to a common input and a common output.

In some embodiments, each cascoded device can be configured such that a base of the common emitter transistor is coupled to the input node, a collector of the common emitter transistor is coupled to an emitter of the common base transistor, and a collector of the common base transistor is coupled to the output node. A base of the common base transistor can be coupled to an emitter of the common emitter transistor through a bypass capacitance.

In some embodiments, the RF amplifier can be a power amplifier (PA). In some embodiments, the PA can be configured to operate with a high-voltage supply.

In some teachings, the present disclosure relates to a semiconductor die that includes a substrate, and a power amplifier (PA) implemented on the substrate and configured to receive and amplify a radio-frequency (RF) signal. The PA includes an array of cascoded devices implemented between an input node and an output node. Each cascoded device includes a common emitter transistor and a common base transistor arranged in a cascode configuration. The array is configured such that the common base transistors are positioned in a staggered orientation relative to each other.

In a number of implementations, the present disclosure relates to a radio-frequency (RF) module that includes a packaging substrate configured to receive a plurality of components, and a power amplification system implemented on the packaging substrate. The power amplification system includes a power amplifier (PA) configured to receive and amplify a radio-frequency (RF) signal. The PA includes an input node and an output node configured to facilitate the amplification of the RF signal. The PA further includes an array of cascoded devices implemented between the input node and the output node. Each cascoded device includes a common emitter transistor and a common base transistor arranged in a cascode configuration. The array is configured such that the common base transistors are positioned in a staggered orientation relative to each other.

In some embodiments, the RF module can be a power amplifier module. In some embodiments, the RF module can be a front-end module.

In accordance with a number of implementations, the present disclosure relates to a wireless device that includes a transceiver configured to generate a radio-frequency (RF) signal, and a front-end module (FEM) in communication with the transceiver. The FEM includes a packaging substrate configured to receive a plurality of components, and a PA configured to amplify the RF signal. The PA includes an input node and an output node configured to facilitate the amplification of the RF signal. The PA further includes an array of cascoded devices implemented between the input node and the output node. Each cascoded device includes a common emitter transistor and a common base transistor arranged in a cascode configuration. The array is configured such that the common base transistors are positioned in a staggered orientation relative to each other. The wireless device further includes an antenna in communication with the FEM. The antenna is configured to transmit the amplified RF signal.

In some embodiments, the wireless device can be, for example, a cellular phone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
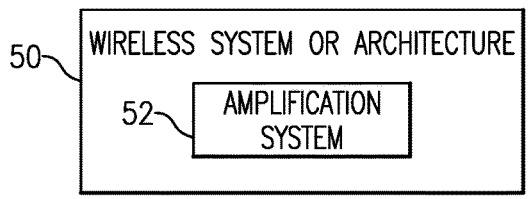
FIG. 1 shows a wireless system or architecture that includes an amplification system.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
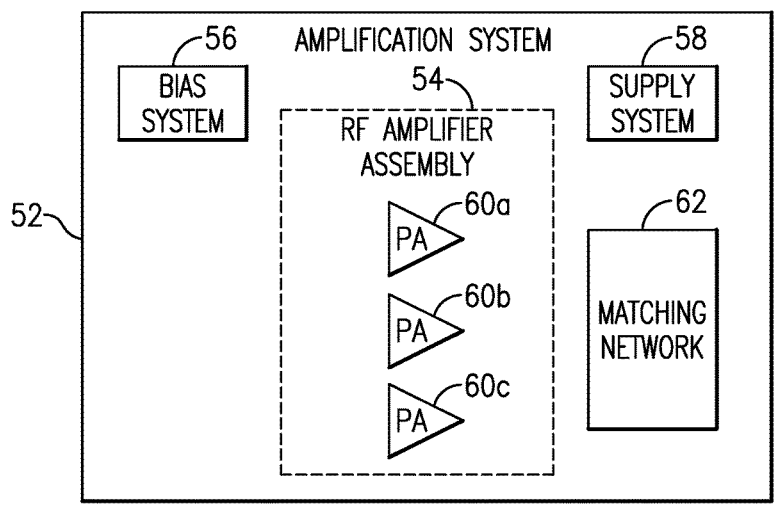
FIG. 2 shows that the amplification system of FIG. 1 can include a radio-frequency (RF) amplifier assembly having one or more power amplifiers (PAs).

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figure 3A:
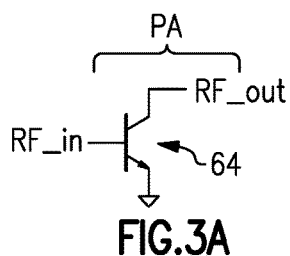
FIGS. 3A-3E show examples of how the PA of FIG. 2 can be configured.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

Figure 3B:
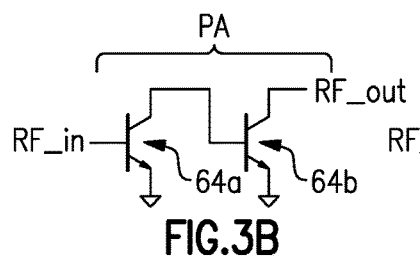

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

Figure 3C:
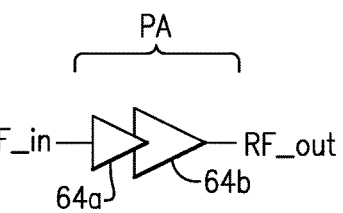

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figure 3D:
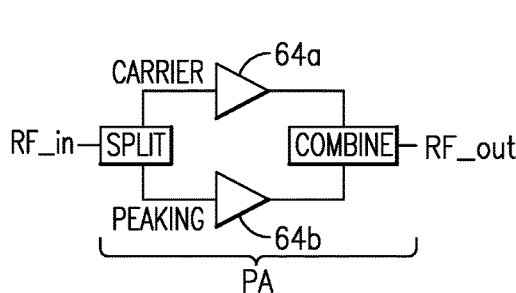

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

Figure 3E:
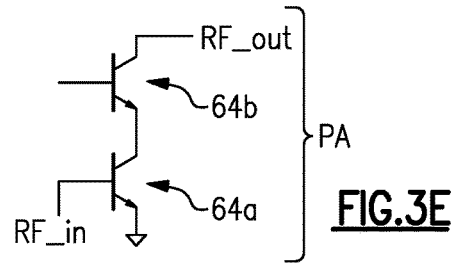

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
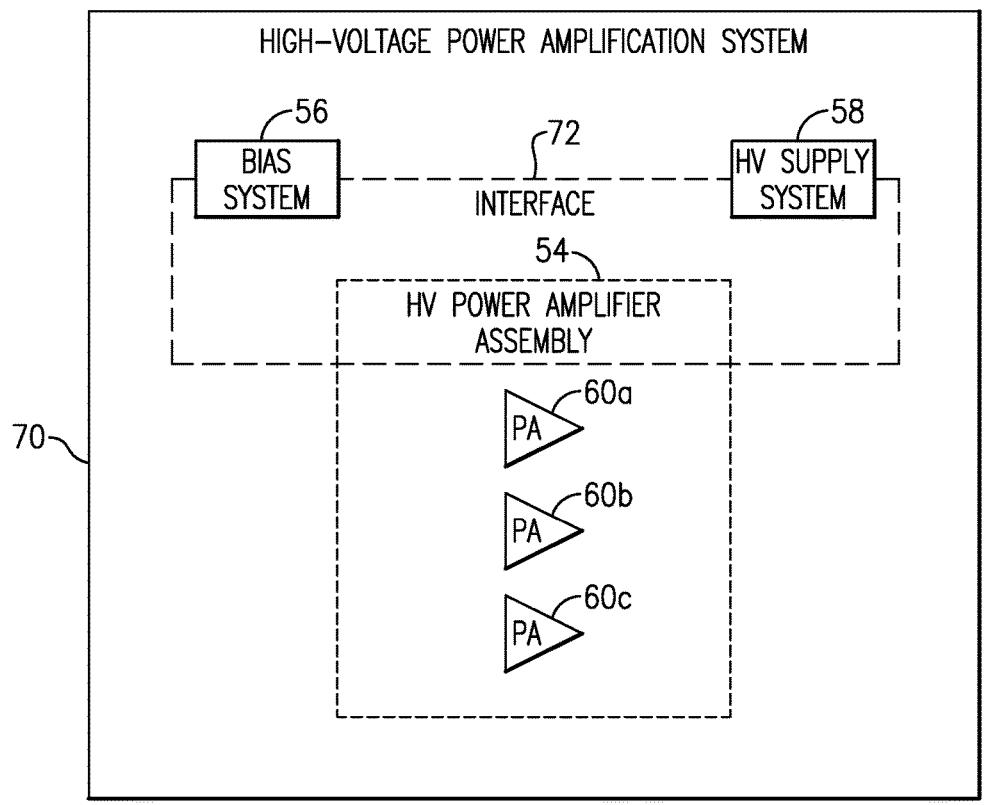
FIG. 4 shows that in some embodiments, the amplification system of FIG. 2 can be implemented as a high-voltage (HV) power amplification system.

FIG. 4 shows that in some embodiments, the amplification system 52 of FIG. 2 can be implemented as a high-voltage (HV) power amplification system 70. Such a system can include an HV power amplifier assembly 54 configured to include HV amplification operation of some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

High thermal dissipation within radio-frequency (RF) power arrays, such as power amplifier (PA) arrays, typically requires sufficient spacing of adjacent elements for ruggedness and device reliability. Such spacing typically requires larger die size which in turn results in higher cost implementations.

Described herein are examples related to reduction of die temperatures without necessarily requiring an increase in die size. Such an advantageous feature can be achieved by selected placement of high thermal dissipation devices within a given array. In the context of a cascode PA array, it is noted that such an array typically includes lower temperature RF devices (also referred to herein as common emitter (CE) devices) and higher temperature cascode devices (also referred to herein as common base (CB) devices). Thus, a stagger arrangement of the RF and cascode transistors can be implemented such that one high temperature device is not directly adjacent to another high temperature device.

Figure 5:
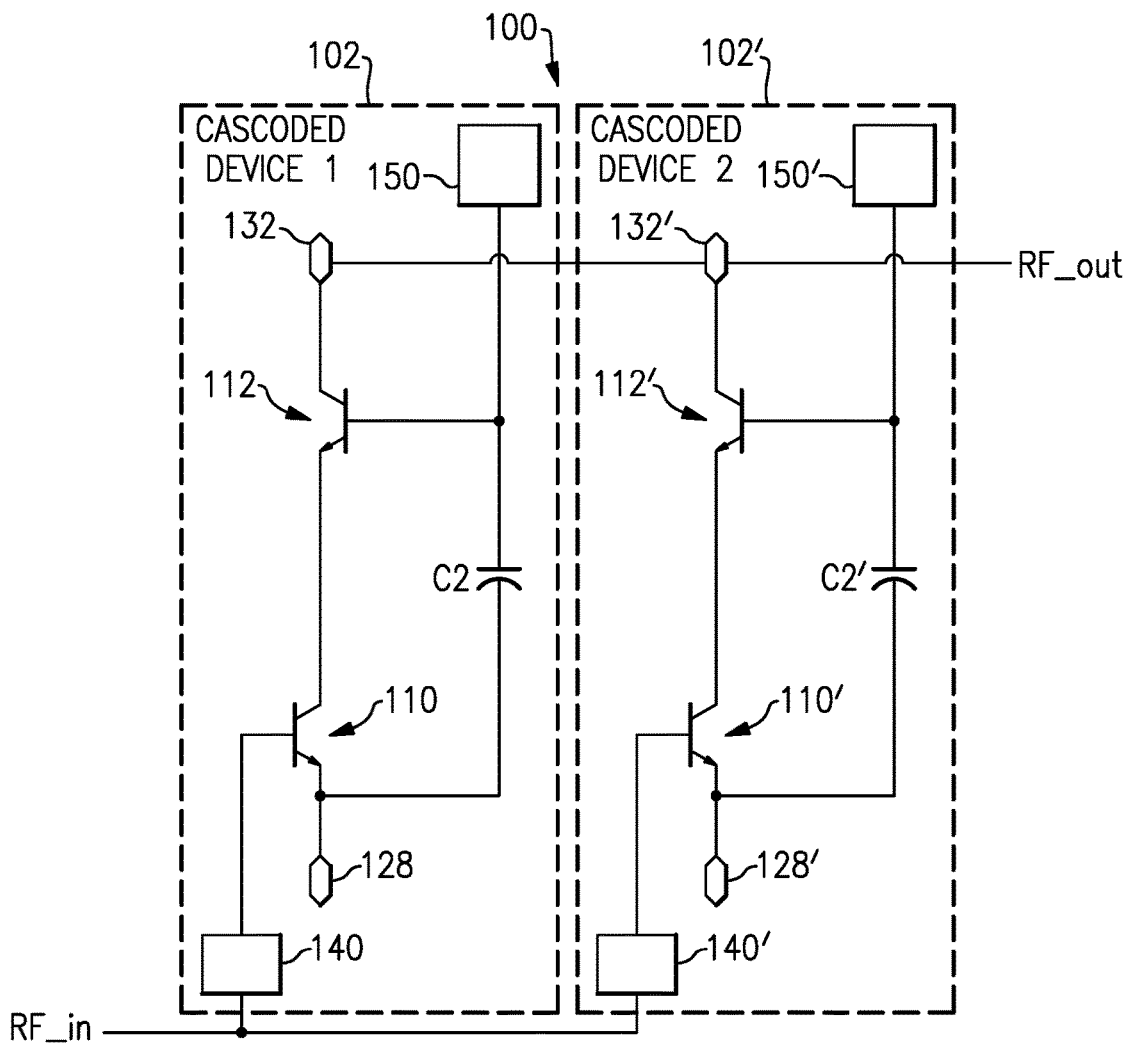
FIG. 5 shows an example of an array of cascoded devices, where each cascoded device includes an RF transistor and a cascode transistor.

FIG. 5 shows an example of an array 100 of cascoded devices, where each cascoded device 102 includes an RF transistor 110 (also referred to herein as a CE device) and a cascode transistor 112 (also referred to herein as a CB device). Among others, examples of how such an array can be implemented are described in U.S. Provisional Application No. 62/116,508 filed Feb. 15, 2015, entitled CASCODE AMPLIFIER SEGMENTATION FOR ENHANCED THERMAL RUGGEDNESS, the disclosure of which is hereby expressly incorporated by reference herein in its entirety.

In the example of FIG. 5, the array 100 is shown to include two cascoded devices 102, 102'. It will be understood that more than two cascoded devices can be arranged in a similar manner.

Referring to FIG. 5, each of the cascoded device (102 or 102') is shown to include a common emitter (CE) device (110 or 110') (also referred to herein as an RF transistor) coupled to a common base (CB) device (112 or 112') (also referred to herein as a cascode transistor). The emitter of the RF transistor (110 or 110') is shown to be coupled to the base of the cascode transistor (112 or 112') through a cascode bypass capacitance (C2 or C2'). The emitter of the RF transistor (110 or 110') can be coupled to ground (128 or 128').

In the example array 100 of FIG. 5, each cascoded device can include its own bias circuits for the RF transistor and the cascode transistor. More particularly, the RF transistor 110 of the first cascoded device 102 is shown to have a input bias circuit 140 coupled to its base, and the cascode transistor 112 is shown to have a cascode bias circuit 150 coupled to its base. Similarly, the RF transistor 110' of the second cascoded device 102' is shown to have an input bias circuit 140' coupled to its base, and the cascode transistor 112' is shown to have a cascode bias circuit 150' coupled to its base.

In the example of FIG. 5, at least some portions of the input bias circuits 140, 140' can be coupled to facilitate, for example, a common RF input (RF_in). Similarly, the collectors 132, 132' of the cascode transistors 112, 112' can be coupled to yield a common RF output (RF_out), and to receive a common supply voltage.

In some embodiments, the array of cascoded devices of FIG. 5 can be implemented so as to yield isolated connections between the parallel elements. For example, the array can be built with a plurality of CE (110)/CB (112) pairs, instead of building a separate CE array and a separate CB array.

Figure 6:
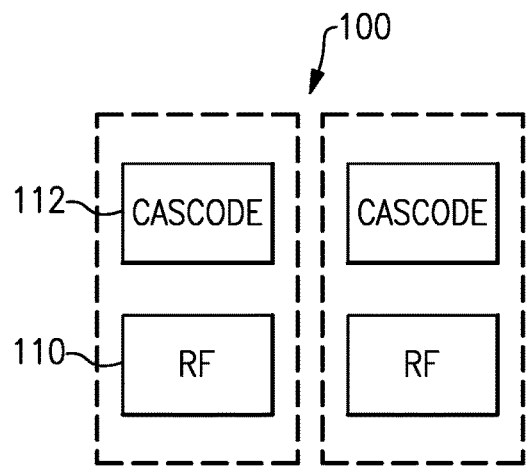
FIG. 6 depicts an example of a physical layout of an array, where the orientations of two cascoded devices are the same.

FIG. 6 depicts an example of a physical layout of an array 100, where the orientations of two cascoded devices are the same. Accordingly, the cascode transistors 112 of the two adjacent cascoded devices are shown to be directly adjacent to each other. The example physical layout of FIG. 6 can represent the example of FIG. 5, if the two cascoded devices 102, 102' are physically laid out as shown in the circuit representation.

Figure 7:
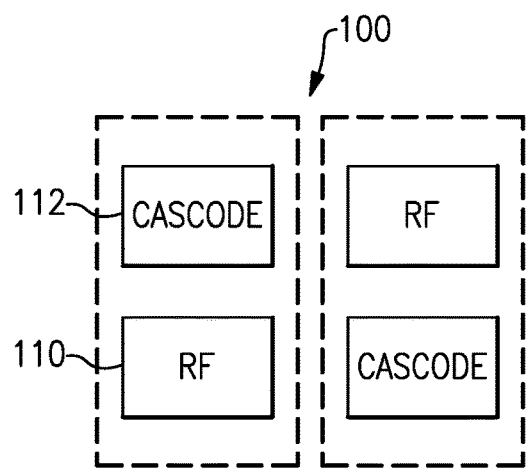
FIG. 7 depicts an example physical layout of an array, where one cascoded device has an inverted orientation relative to an adjacent cascoded device, so as to form a staggered configuration.

FIG. 7 depicts an example physical layout of an array 100, where one cascoded device has an inverted orientation relative to an adjacent cascoded device, so as to form a staggered configuration. Accordingly, the cascode transistor 112 of one cascoded device (e.g., upper portion of the cascoded device on the left) is at a diagonal orientation relative to the cascode transistor 112 of the adjacent cascoded device (e.g., lower portion of the cascoded device on the right). It is noted that the distance between such diagonally arranged cascode transistors 112 is greater than the distance between the directly adjacent cascode transistors 112 of FIG. 6, if all other dimensions remain generally the same.

Figure 8:
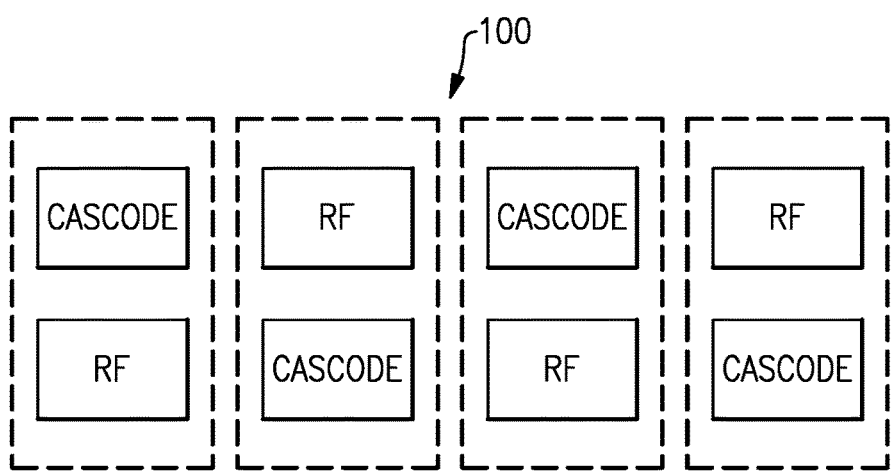
FIG. 8 shows that an array can include more than two cascoded devices.

FIG. 8 shows that an array 100 can include more than two cascoded devices. Such cascoded devices can be arranged as a continuation of the staggered configuration of the example of FIG. 7. Accordingly, it is noted that each cascode transistor 112 is at a diagonal arrangement relative to another cascode transistor 112 of an adjacent cascoded device.

Figure 9:
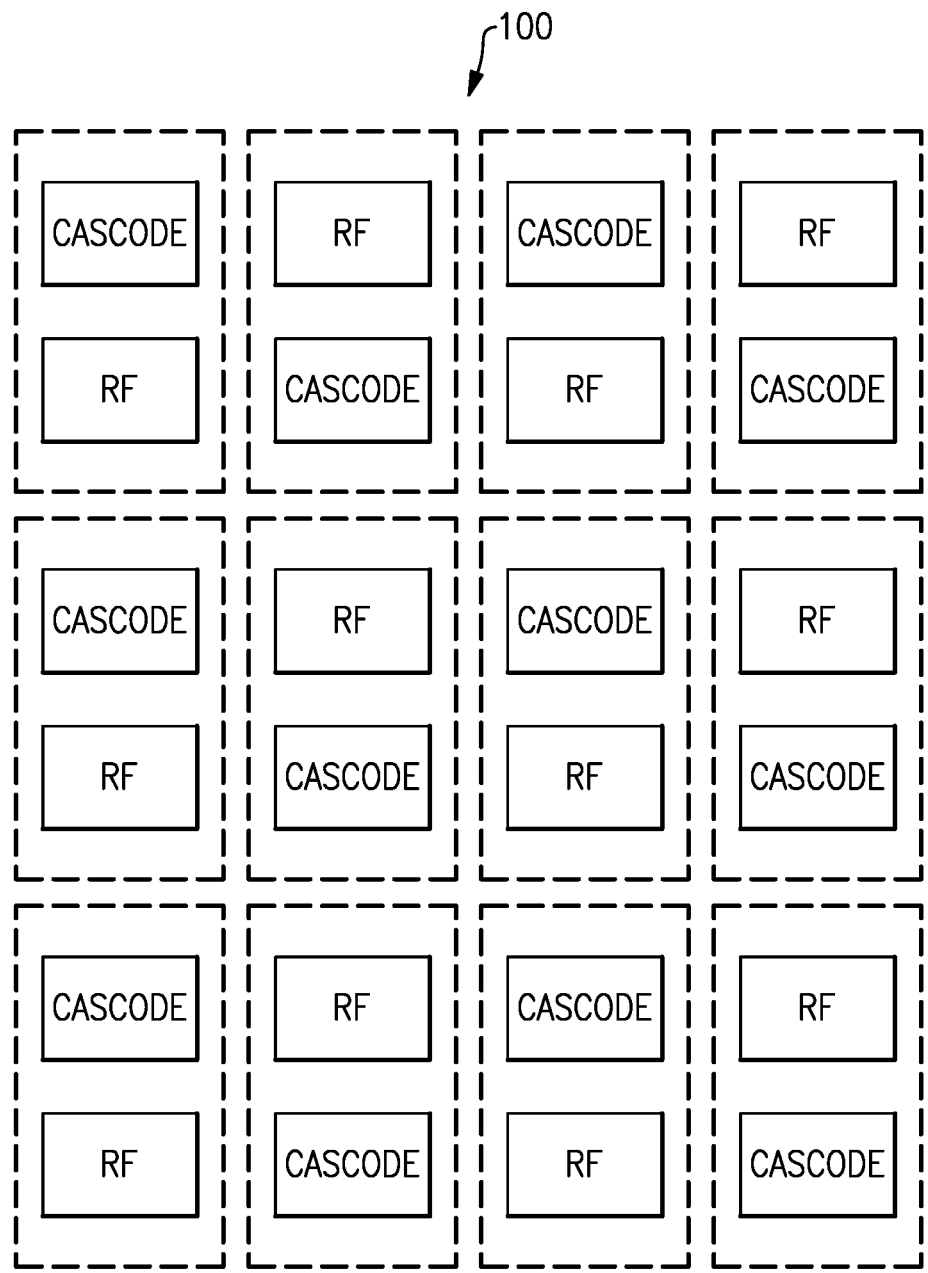
FIG. 9 shows that an array can include more than one row of cascoded devices so as to yield a two-dimensional arrangement.

In the foregoing example of FIG. 8, one row of cascoded devices are shown. FIG. 9 shows that an array 100 can include more than one row of cascoded devices so as to yield a two-dimensional arrangement. In such a two-dimensional arrangement, a given row (e.g., such as the row of FIG. 8) can have an offset arrangement with an adjacent row, such that between such two rows, there is no direct row-to-row adjacent pair of cascode transistors 112.

Figure 10:
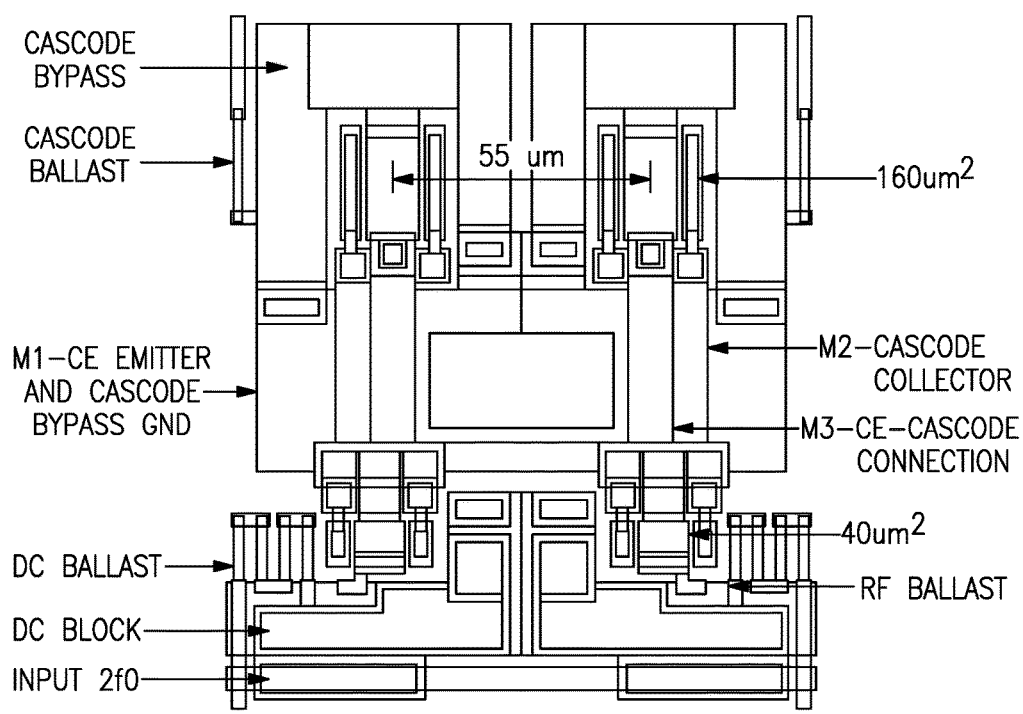
FIG. 10 shows an example layout that is similar to the block diagram representation of FIG. 6.
Figure 11:
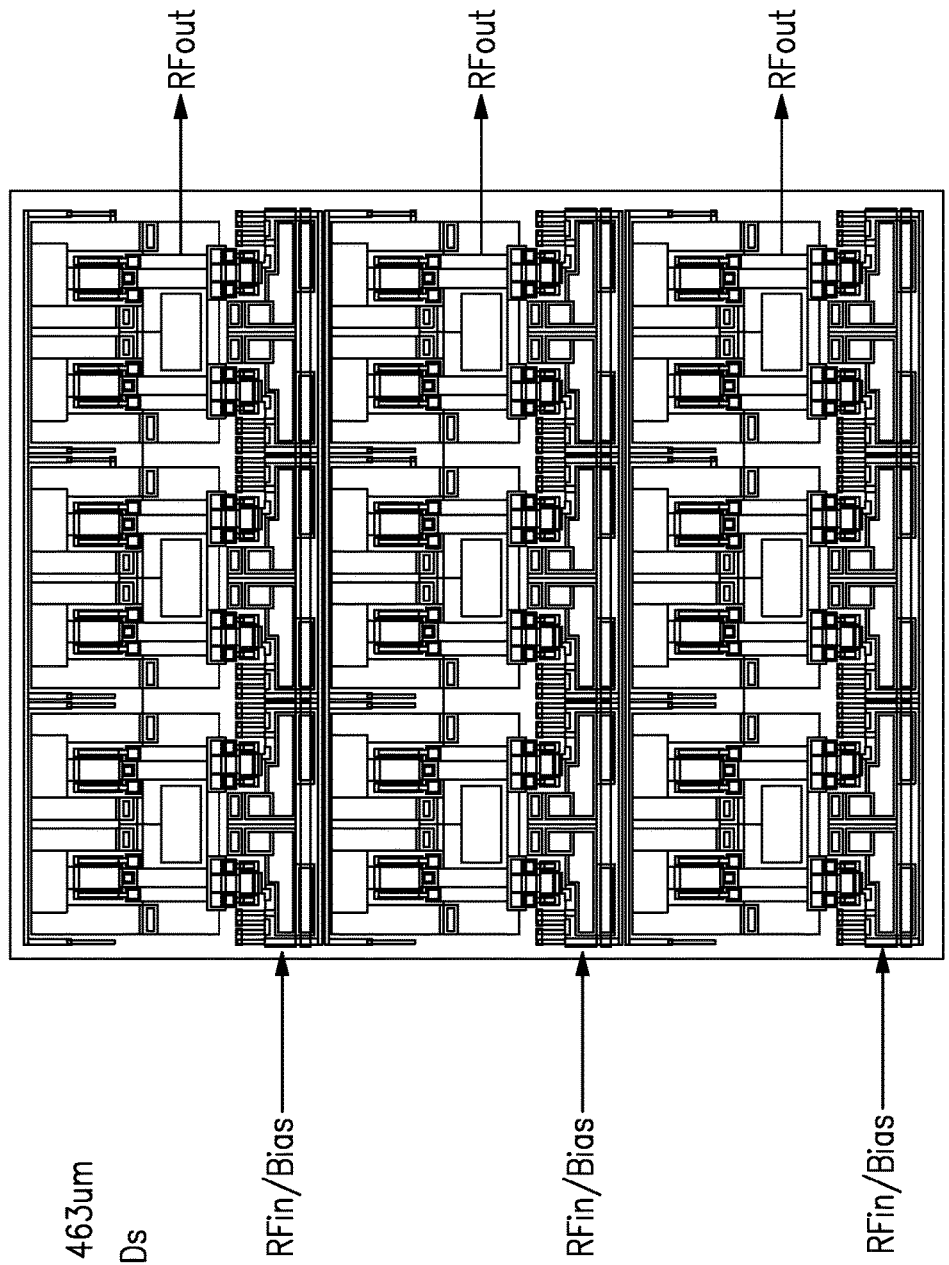
FIG. 11 shows an example of a two-dimensional array that is based on the non-staggered configuration of FIG. 6.
Figure 12:
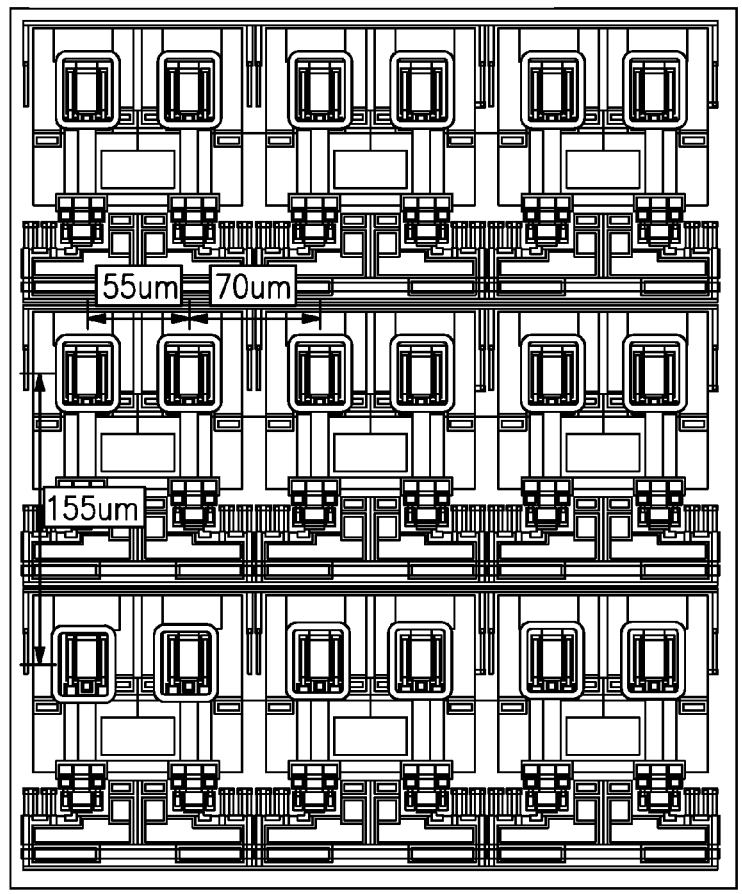
FIG. 12 shows another view of the two-dimensional array of FIG. 11.
Figure 14:
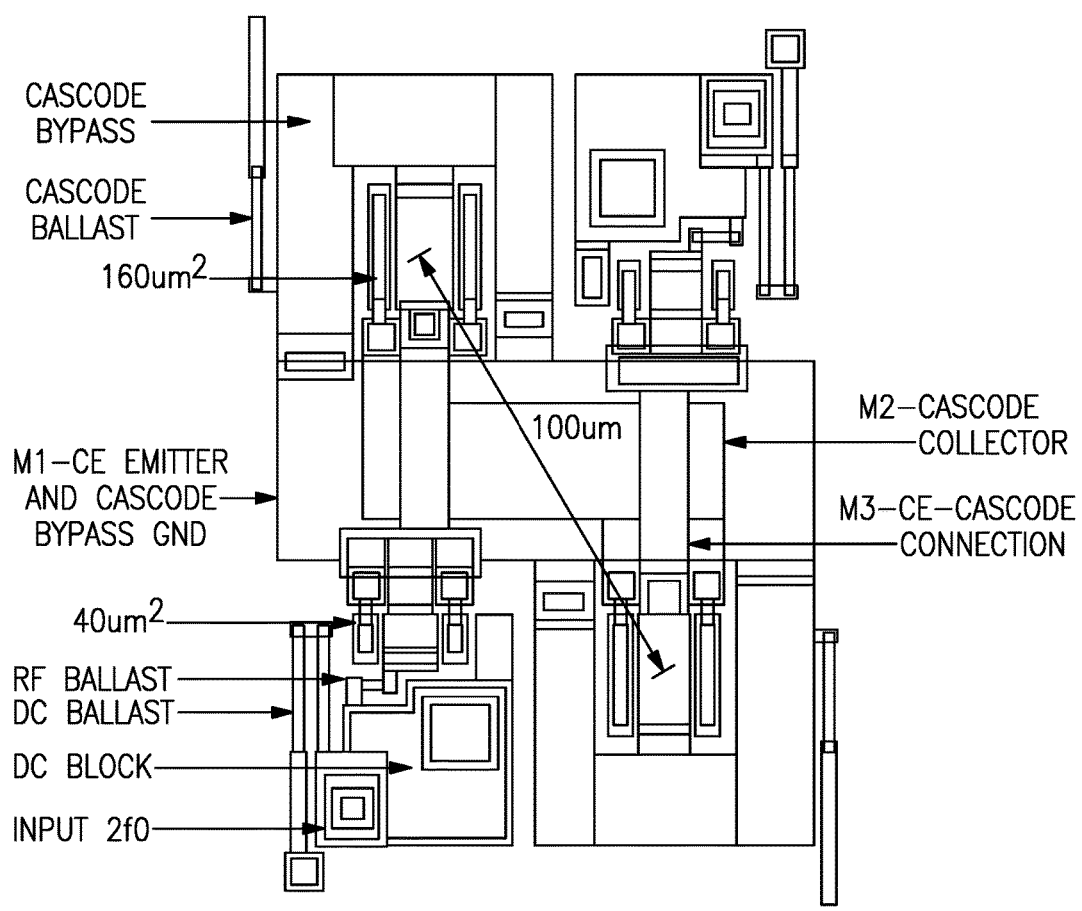
FIG. 14 shows an example layout that is similar to the block diagram representation of FIG. 7.
Figure 15:
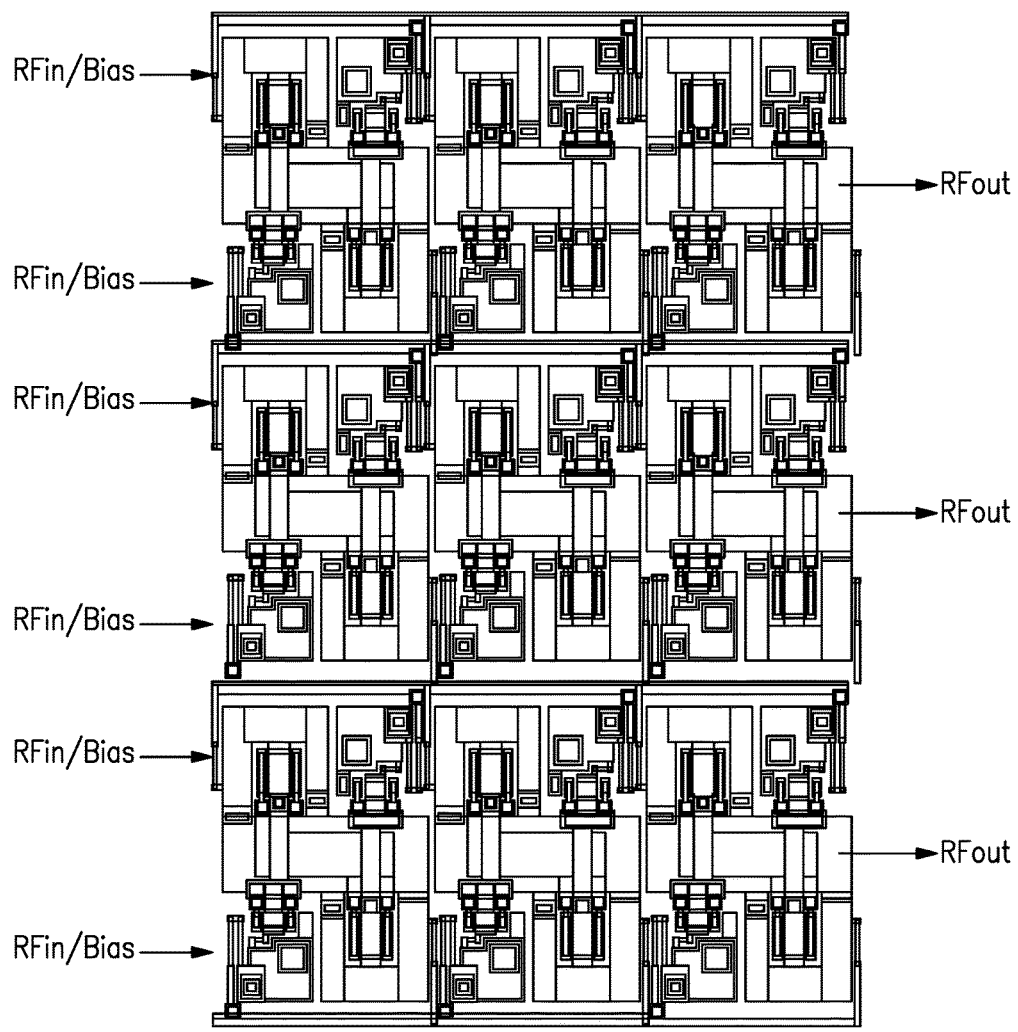
FIG. 15 shows an example of a two-dimensional array that is based on the staggered configuration of FIG. 7.
Figure 16:
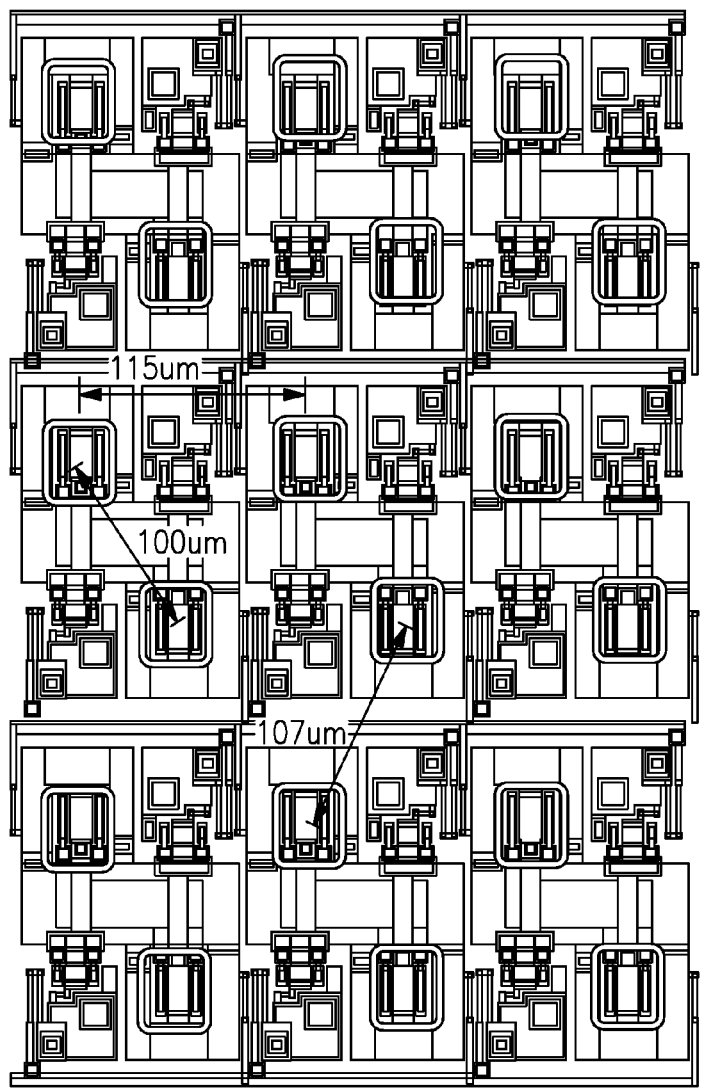
FIG. 16 shows another view of the two-dimensional array of FIG. 15.

FIG. 10 shows an example layout that is similar to the block diagram representation of FIG. 6. FIGS. 11 and 12 show an example of a two-dimensional array that is based on the non-staggered configuration of FIG. 6. FIG. 14 shows an example layout that is similar to the block diagram representation of FIG. 7, in which the cascode transistors are in a staggered configuration. FIGS. 15 and 16 show an example of a two-dimensional array that is based on the staggered configuration of FIG. 7. In the examples shown, various values such as dimensions are shown. It will be understood that such values are examples, and that other values can be utilized.

For the purpose of comparing the foregoing non-staggered and staggered configurations, it will be understood that dimensions associated with a given cascoded device (whether in non-staggered or staggered arrangement) generally remain the same. For example, each RF transistor has an area of approximately 40 µm$^2$, each cascode transistor has a much larger area of approximately 160 µm$^2$, and the center-to-center spacing between two directly adjacent cascode transistors is approximately 55 µm.

As stated above, two cascode transistors are spaced at approximately 55 µm when in a direct adjacent configuration (e.g., see FIG. 10). When in a diagonal configuration resulting from a staggered configuration, center-to-center spacing between the cascode transistors of two adjacent cascode devices is approximately 100 µm (e.g., see FIG. 14) which is almost twice the 55 µm separation.

Figure 13:
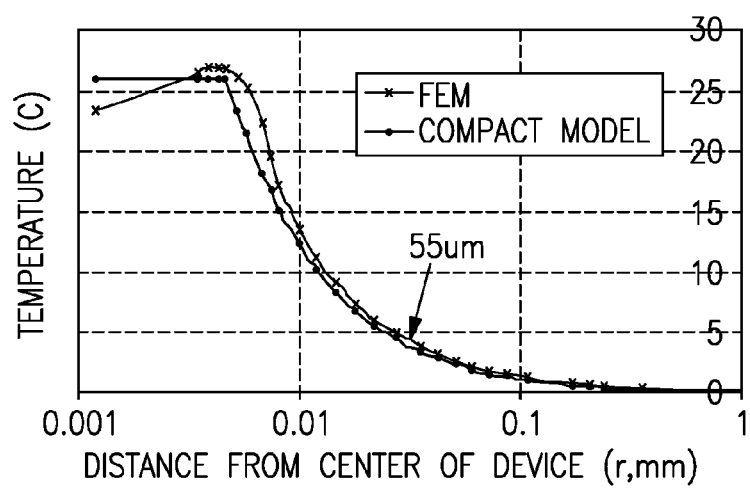
FIG. 13 shows temperature profiles at an example spacing between cascode transistors in the two-dimensional array of FIG. 12.
Figure 17:
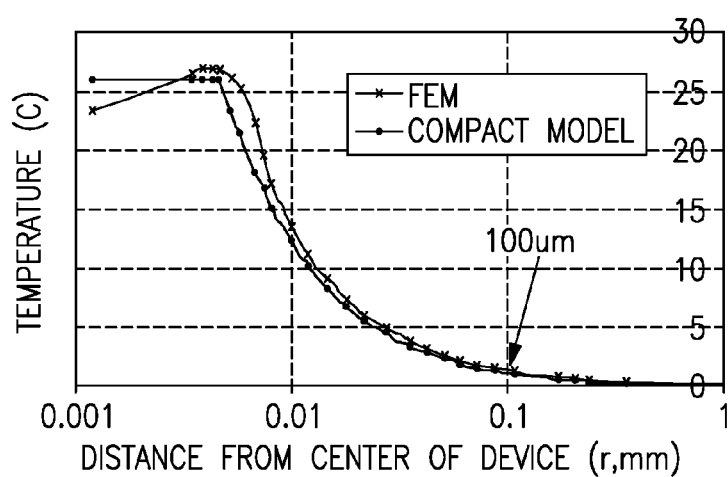
FIG. 17 shows temperature profiles at an example spacing between cascode transistors in the two-dimensional array of FIG. 16.

Accordingly, the two-dimensional array of FIGS. 15 and 16 (having the staggered and row-offset configuration) is expected to have better thermal dissipation property than the two-dimensional array of FIGS. 11 and 12 (having the direct adjacent configuration within a given row). FIGS. 13 (direct adjacent configuration) and 17 (staggered and row-offset configuration) show that such is indeed true. Compared to about 4 degree C. rise in temperature (FIG. 13) due to the 55 µm spacing of the direct adjacent configuration, the staggered and row-offset configuration yields a temperature rise that is less than 2 degree C. (FIG. 17) due to the 100 µm spacing.

Referring to FIGS. 11 (direct adjacent configuration) and 15 (staggered and row-offset configuration), one can see that the latter configuration can yield narrower but taller dimensions compared to the former configuration. In some embodiments, such narrower dimension can be allowed due to the stagger configuration in which two cascoded devices can be brought closer together without the cascode transistors becoming too close. In some embodiments, such taller dimension can facilitate RF signal input and biasing connections associated with the row-offset configuration.

Figure 18:
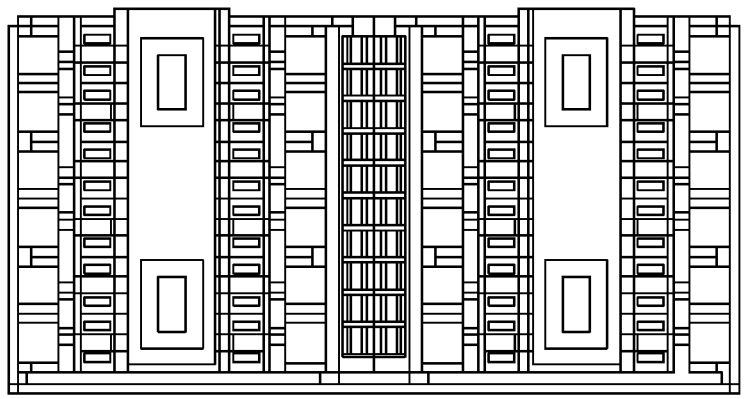
FIG. 18 shows a comparison of areas associated with non-staggered and staggered arrays.
Figure 18:
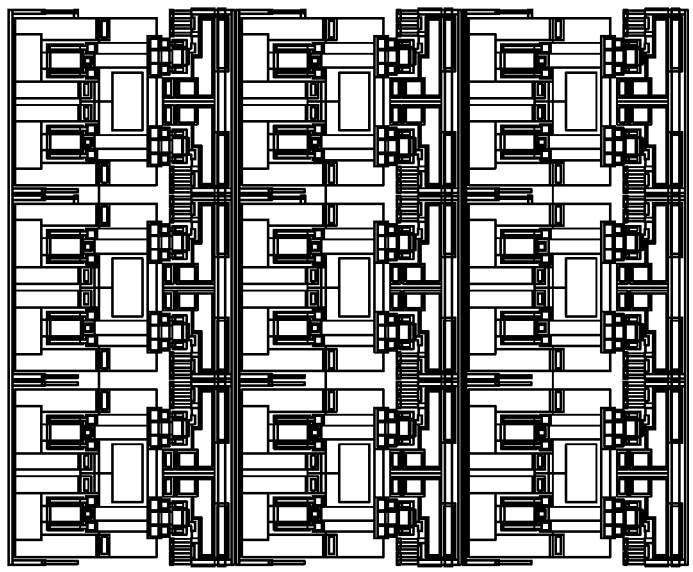
Figure 18:
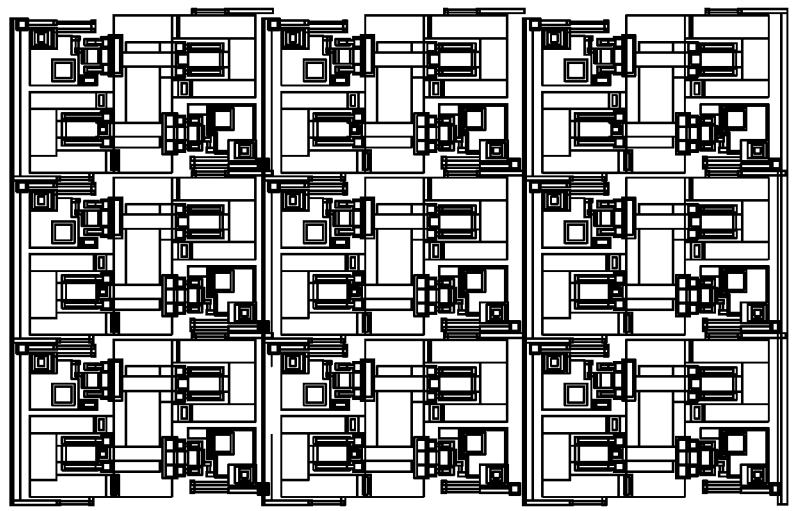

FIG. 18 shows a comparison of areas of the two foregoing example arrays, as well as an array of common emitters. One can see that the staggered cascode array on the left has an overall area that is similar to the area of the non-staggered array in the center.

For the purpose of description, it will be understood that an array can include a plurality of units (e.g., cascoded devices) arranged in one or more rows and/or columns. Thus, an array can include a plurality of units arranged in a single row, such as in the examples of FIGS. 7, 8 and 14. An array can also include a plurality of units arranged in a plurality of rows, such as in the examples of FIGS. 9, 15 and 16.

It will also be understood that in an array of cascoded devices, each cascoded device can have a separate input and a separate output for an RF signal, a common input and a common output for each of a plurality of groups of cascoded devices, a common input and a common output for all of the cascoded devices in the array, or any combination thereof. For example, in the example of FIG. 15, each row of three cascoded devices can be arranged in an electrically parallel manner, sharing a common input and a common output for an RF signal. Thus, in such an example context, the two-dimensional array of nine cascoded devices can provide three separate amplification paths.

In some embodiments, an array of cascoded devices having one or more features as described herein can be implemented on a semiconductor die. For example, the array of cascoded devices of FIGS. 15 and 16 can be implemented on a single semiconductor die.

Figure 19:
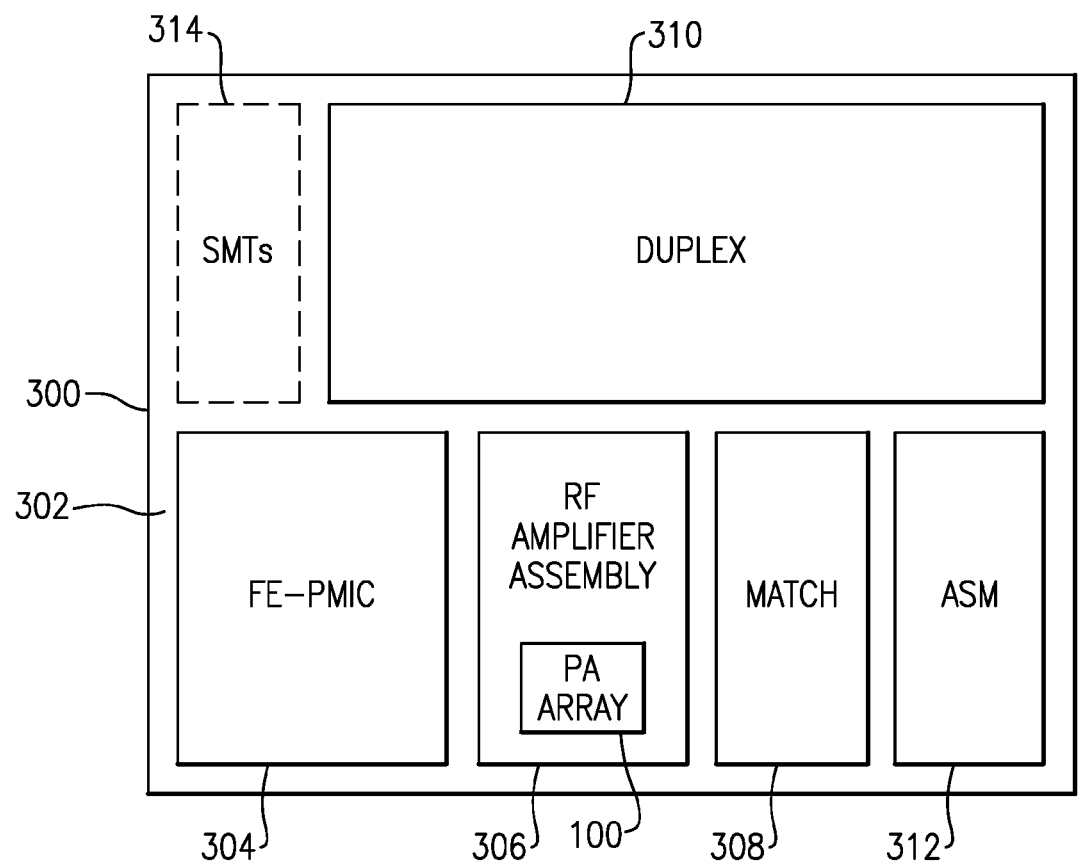
FIG. 19 shows that in some embodiments, some or all of a PA array having one or more features as described herein can be implemented in a module.

FIG. 19 shows that in some embodiments, one or more features associated with a cascode architecture as described herein (e.g., array 100 in FIGS. 7-9 and 14-16) can be implemented in a module. Such a module can be, for example, a front-end module (FEM). In the example of FIG. 19, a module 300 can include a packaging substrate 302, and a number of components can be mounted on such a packaging substrate. For example, an FE-PMIC component 304, a power amplifier assembly 306, a match component 308, and a duplexer assembly 310 can be mounted and/or implemented on and/or within the packaging substrate 302. Other components such as a number of SMT devices 314 and an antenna switch module (ASM) 312 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 20:
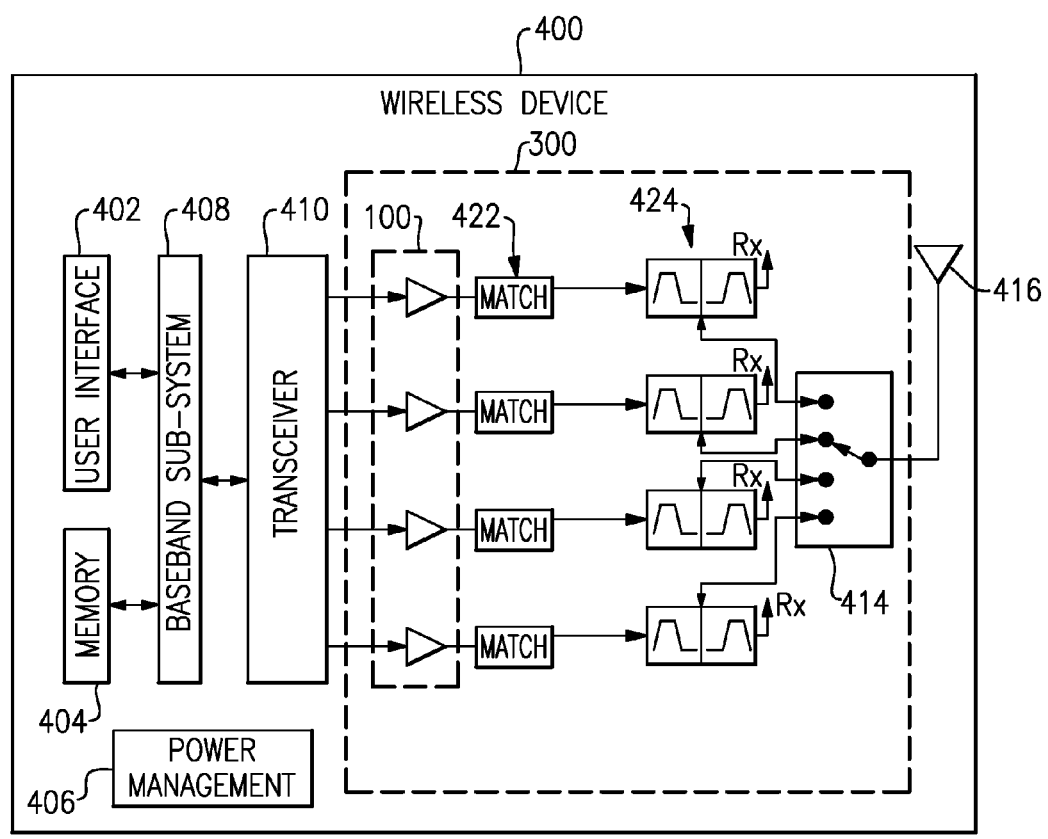
FIG. 20 depicts an example wireless device having one or more advantageous features described herein.

FIG. 20 depicts an example wireless device 400 having one or more advantageous features described herein. In the context of a module having one or more features as described herein, such a module can be generally depicted by a dashed box 300, and can be implemented as, for example, a front-end module (FEM). Such a module can include an array 100 of cascoded devices as described herein.

Referring to FIG. 20, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user.

The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 420. Such amplified and filtered signals can be routed to an antenna 416 through an antenna switch 414 for transmission. In some embodiments, the duplexers 420 can allow transmit and receive operations to be performed simultaneously using a common antenna (e.g., 416). In FIG. 20, received signals are shown to be routed to "Rx" paths that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for manufacturing a radio-frequency amplifier, the method comprising:
providing or forming a semiconductor substrate; and
forming an array of cascoded devices on the semiconductor substrate to be capable of amplifying a signal, such that the array of cascoded devices includes a plurality of cascoded devices arranged in a first row and a plurality of cascoded devices arranged in a second row, each cascoded device including an input stage and an output stage arranged in a cascode configuration, each of the first and second rows configured such that the output stages are positioned in a staggered orientation, the staggered arrangement of the cascoded devices in the first row offset relative to the staggered arrangement of the cascoded devices in the second row to avoid a direct row-to-row adjacent pair of output stages.

2. The method of claim 1 wherein the input stage includes a common emitter transistor, and the output stage includes a common base transistor.

3. The method of claim 1 wherein at least some of the cascoded devices are electrically connected in parallel.

4. The method of claim 3 wherein the plurality of cascoded devices in the first row are electrically connected in parallel.

5. The method of claim 4 wherein the plurality of cascoded devices in the second row are electrically connected in parallel.

6. The method of claim 1 wherein the plurality of cascoded devices in each of the first row and the second row are coupled to a common input and a common output.

7. The method of claim 1 wherein the radio-frequency amplifier is a power amplifier configured to operate with a high-voltage supply.

8. A radio-frequency amplifier comprising:
a semiconductor substrate; and
an array of cascoded devices implemented on the semiconductor substrate and capable of amplifying a signal, the array of cascoded devices including a plurality of cascoded devices arranged in a first row and a plurality of cascoded devices arranged in a second row, each cascoded device including an input stage and an output stage arranged in a cascode configuration, each of the first and second rows configured such that the output stages are positioned in a staggered orientation, the staggered arrangement of the cascoded devices in the first row offset relative to the staggered arrangement of the cascoded devices in the second row to avoid a direct row-to-row adjacent pair of output stages.

9. The radio-frequency amplifier of claim 8 wherein the input stage includes a common emitter transistor, and the output stage includes a common base transistor.

10. The radio-frequency amplifier of claim 8 wherein the staggered orientation of the output stages provide an increase in a nearest pair spacing in the corresponding row, when compared to a non-staggered orientation.

11. The radio-frequency amplifier of claim 10 wherein the output stage is configured to handle more power than the corresponding input stage.

12. The radio-frequency amplifier of claim 10 wherein the increased spacing results in a smaller rise in temperature due to the operation of the radio-frequency amplifier, when compared to the non-staggered orientation.

13. The radio-frequency amplifier of claim 12 wherein the rise in temperature resulting from the staggered orientation is less than half of the rise in temperature resulting from the non-staggered orientation.

14. The radio-frequency amplifier of claim 8 wherein at least some of the cascoded devices are electrically connected in parallel.

15. The radio-frequency amplifier of claim 14 wherein the plurality of cascoded devices in the first row are electrically connected in parallel.

16. The radio-frequency amplifier of claim 15 wherein the plurality of cascoded devices in the second row are electrically connected in parallel.

17. The radio-frequency amplifier of claim 8 wherein the plurality of cascoded devices in each of the first row and the second row are coupled to a common input and a common output.

18. The radio-frequency amplifier of claim 8 wherein the radio-frequency amplifier is a power amplifier configured to operate with a high-voltage supply.

19. A semiconductor die comprising:

a substrate; and an amplifier implemented on the substrate and configured to amplify a signal, the amplifier including an array of cascoded devices having a plurality of cascoded devices arranged in a first row and a plurality of cascoded devices arranged in a second row, each cascoded device including an input stage and an output stage arranged in a cascode configuration, each of the first and second rows configured such that the output stages are positioned in a staggered orientation, the staggered arrangement of the cascoded devices in the first row offset relative to the staggered arrangement of the cascoded devices in the second row to avoid a direct row-to-row adjacent pair of output stages.

20. The semiconductor die of claim 19 wherein the amplifier is configured as a power amplifier.

* * * * *